(12) United States Patent
Lee

(10) Patent No.: US 6,284,721 B1
(45) Date of Patent: Sep. 4, 2001

(54) CLEANING AND ETCHING COMPOSITIONS

(76) Inventor: Ki Won Lee, 108-10, Il-dong, Ansan-si, Kyunggi-do 425-150 (KR)

( * ) Notice: Subject to any disclaimer, the term of this patent is extended or adjusted under 35 U.S.C. 154(b) by 0 days.

(21) Appl. No.: 09/358,111

(22) Filed: Jul. 21, 1999

Related U.S. Application Data

(63) Continuation-in-part of application No. 09/142,750, filed on Sep. 15, 1998, now abandoned.

(30) Foreign Application Priority Data

Jan. 21, 1997 (KR) .................................................. 97-1539
Oct. 17, 1997 (KR) ................................................ 97-53384

(51) Int. Cl.[7] .................................................. C03C 25/68
(52) U.S. Cl. ........................ 510/175; 252/79.1; 438/689; 134/2; 134/3
(58) Field of Search ............................... 216/102, 13, 90; 430/297, 270, 276, 296; 428/423, 213, 421; 427/558; 134/1, 3, 2; 510/175, 176; 252/79.1; 438/689

(56) References Cited

U.S. PATENT DOCUMENTS

| | | |
|---|---|---|
| 3,565,707 | 2/1971 | Radimer et al. . |
| 3,654,001 | 4/1972 | Mann . |
| 3,725,224 | 4/1973 | Kendall . |
| 3,986,970 | 10/1976 | Shiga . |
| 4,517,106 | 5/1985 | Hopkins et al. . |
| 4,555,304 | 11/1985 | Sälzle . |
| 4,614,607 | 9/1986 | Loch . |
| 5,164,018 | 11/1992 | Barcelona et al. . |
| 5,211,807 | 5/1993 | Yee . |
| 5,393,447 | 2/1995 | Carlson et al. . |
| 5,688,755 | 11/1997 | Ikeda et al. . |
| 5,810,938 | 9/1998 | Murphy . |

FOREIGN PATENT DOCUMENTS

| | | |
|---|---|---|
| 183 883 | 11/1955 | (AT) . |
| 1 209 844 | 1/1966 | (DE) . |
| 0 106 301 A1 | 4/1984 | (EP) . |
| 1 276 550 | 6/1972 | (GB) . |

Primary Examiner—Yogendra N. Gupta
Assistant Examiner—Gregory E. Webb
(74) Attorney, Agent, or Firm—Renner, Otto, Boisselle & Sklar, LLP

(57) ABSTRACT

A cleaning and etching composition for cleaning and etching substrates comprising quartz, glass, silicon oxide or silicon as a main constituent is disclosed. A cleaning composition for cleaning substrates having a silicon oxide layer comprises: a fluoride which decomposes and releases fluoride ion in aqueous solution during cleaning and etching processes for reacting with silicon; and a persulfate which decomposes and releases hydrogen peroxide in the aqueous solution for increasing the oxidation effect of the fluoride. Display device substrates having silicon oxide layer and LCD glass substrates can be cleaned without imparting damages, as a result, a safe cleaning process can be implemented. A cleaning composition for cleaning substrates having a silicon layer comprises a fluoride, an inorganic acid and/or nitric acid. The above cleaning compositions can also be suitably utilized as an etchant for etching silicon and silicon oxide layers. The cleaning and etching composition of the present invention provides an is effective control of etching rates, thus the factors related to the etching process can be flexibly adjusted.

7 Claims, 2 Drawing Sheets

CLEANING AND ETCHING COMPOSITIONS

CROSS REFERENCE TO RELATED APPLICATIONS

This is a continuation-in-part of application Ser. No. 09/142,750, which was filed on Sep. 15, 1998, which is now abandoned USPTO.

BACKGROUND OF THE INVENTION

1. Field of the Invention

The present invention relates to a composition for cleaning and etching electronic display devices and substrates, and more particularly to a composition for etching Si, $SiO_2$, $SiN_x$, and metallic thin layers while also removing contaminants formed on the surfaces of the etching layers during the manufacturing process of electronic display devices, quartz devices, and semiconductor substrates.

2. Description of the Prior Art

In general, the manufacture of electronic display devices and substrates commonly involves cleaning and etching steps. For example, in the manufacture of Cathode Ray Tube (CRT), a multi-step cleaning is implemented. Prior to coating process, CRT bulb is subjected to a cleaning process which involves 10~18% hydrofluoric Acid (HF) solution. Then, the steps of inner panel black coating, screen coating, lacquer coating, aluminizing, funnel inner graphite coating, panel/funnel frit sealing, neck washing, mounting and exhausting, funnel outer graphite coating, and panel face coating are performed. For the panel face coating, the coating materials may include $In_2O_3$, $Sb_2O_3$, and $SiO_2$, and prior to face coating, the surface contaminants are removed by cleaning with 1~2% HF or hydrogen ammonium fluoride (or ammonium bifluoride) solution. For defective coating layers, a 10~30% ammonium bifluoride solution is used (before sintering process) and polishing with $CeO_2$ is required (after backing).

In the manufacture of another electronic display device LCD, the manufacturing process may include cleaning and etching during lithography. Here, in the surfaces of a large substrates, it is important to etch uniformly to obtain a high degree of accuracy.

The table below shows compositions for cleaning and etching solutions commonly used and the types of materials to be cleaned and etched for LCD and semiconductor wafer.

| | |
|---|---|
| For cleaning $SiO_2$ | 1. $H_2SO_4:H_2O_2$ (6:1), 120° C. |
| | 2. 50% $HF:H_2O$ (1:100~1000) |
| | 3. $NH_4OH:H_2O_2:H_2O$ (1:1:7) SC-1 |
| | 4. $Hcl:H_2O_2:H_2O$ (1:1:6) SC-2 |
| | 5. D.I.W. (deionized water) rinse |
| For etching $SiO_2$ layer | 1. 40% NH4F:50% HF (7:1) BOE |
| | 2. 40% NH4F:50% HF (7:1) +$H_2O_2$ |
| For etching $SiN_x$ layer | $H_3PO_4:H_2O$ (85:1) or |
| | 40% $NH_4F$:50% HF (20:1) |
| For etching Al and its alloy layer | $H_3PO_4:CH_3COOH:HNO_3:H_2O$ (65:5:5:25) |

The required conditions of above cleaning and etching solutions may include control of cleaning and etching rate, etching selectivity for upper and lower layers, control of etching profile, control of etching within the multi-layers, stability and homogeneity of the solutions, and reproducibility of etching process.

For quartz devices which are used for manufacturing of wafer, the manufacturing process is outlined as follows:

Raw material-cleaning (11~16.5% HF solution, 2~3 minutes)—waxing—cutting and polishing—dewaxing—ultrasonic washing—cleaning (15% HF solution, 5 minutes)—benching—cleaning (11~16.5% HF solution, 5 minutes)—drying—heating (1200° C.)—cleaning (11~16.5% HF solution, 5 minutes)—drying.

Here, a high concentration of HF solution are used for removing the surface contaminants and thermally oxidized layer formed during the above process, but HF solution may cause problems relating to smoothness, etching damage, crack, etc. The quartz devices thus obtained are then used for depositing layers and further heat-treating a wafer, and the contaminants formed during the latter processes are also cleaned by the utilization of HF solution at 2~25% concentration.

The following outline describes the fabrication process of semiconductor wafers:

I. Wafer Manufacturing Process

1. Growing single crystal silicon.
2. Slicing.
3. Lapping (approximately 60 micro-meters by mechanical polishing).
4. Chemical etching (approximately 30 micro-meters by etching).
5. Polishing (etching approximately 10 micro-meters by polishing three times to acquire desired roughness).
6. Cleaning.

II. Semiconductor Device Fabrication Process

7. Initial cleaning.
8. Oxidization (prior to oxidization, the substrate surface is occupied by Si layer).
9. Diffusing (prior to diffusing, the substrate surface is occupied by $Si/SiO_2/Si_3N_4$ layers).
10. Ion dopping (prior to ion dopping, the substrate surface is occupied by $SiO_2/Si_3N_4$ layer).
11. Epithexial growth (prior to epithexial growth, the substrate surface is occupied by Si layer).
12. Forming of insulating and conductive layer—CVD (prior to forming insulating and conductive layer, the substrate surface is occupied by poly-$Si/SiO_2$ layers).
13. Forming of electrodes—PVD (prior to forming electrodes, the substrate surface is occupied by $Si/SiO_2$ layers).

The above processes 8~12 are accompanied by photolithography process. As silicon substrate is subjected to the processes, chemical etching involving silicon and silicon oxide are performed, and during etching, ionic, non-ionic and other contaminants which should be removed are formed on Si and $SiO_2$ layers.

The cleaning and etching processes which are essential in the manufacture of semiconductors are described in more details by the following.

The oxidizing process 8 includes a pre-washing step prior to forming $SiO_2$ layer on the substrate, however, the pre-washing solution such as solvent, sulfuric acid, and/or hydrogen peroxide may produce a thin silicon oxide layer in a thickness of 100–200 angstroms on the surface while washing. Such thin silicon oxide silica layer should be removed by HF solution (HF:H2O=10:1).

Diffusing process 9 also includes a pre-washing step prior to diffusing. The washing solution such as a mixed solution of sulfuric acid and hydrogen peroxide or a mixed solution of ammonium hydroxide and hydrogen peroxide can usually remove organic contaminants and ionic contaminants by dipping for 10~20 minutes at an elevated temperature. However, such washing causes a formation of undesirable oxidized layer on the air-exposed part of silicon surface, which should by removed by dipping a wafer in a diluted HF solution.

In a photolithography process, etchant is used to define the portion to be ion-implemented or diffused and the portion be left intact on the surface of substrates.

Here, etching is a process which selectively removing the thin layers under a photoresist film after the development of the exposed photoresist film in accordance with the necessity. The portion covered by the photoresist film is protected in etching and thus remains after etching. The exposed portion under the photoresist film is etched and then removed.

Conventionally, there are two kinds of etching, one is wet etching or chemical etching and the other is dry etching or plasma etching. Etching includes the removing of the photoresist film.

Wet etching utilizes a chemical solution which causes a chemical reaction between the etching solution and the layer to be etched or removed to solubilize the reaction products. The chemical to be used and its composition ratio in an etching solution varies according to the types of layer to be etched.

The principle of conventional wet etching of silicon oxide layer is described by the following.

First, $SiO_2$ layer is formed by two conventionally utilized methods. In one method, $SiO_2$ layer is grown on silicon substrate at a high temperature, and the other is a CVD method which deposits $SiO_2$ on various films. The $SiO_2$ layer formed by these two methods and other existing conventional methods is susceptible to the dissolving nature of HF, as shown by the following formula for the thermal-grown $SiO_2$ layer.

$$HF \rightarrow H^+ + F^-$$

The dissociated $F^-$ ion reacts with $SiO_2$ layer to perform etching as follows.

$$SiO_2 + 4HF \rightarrow SiF_4 + 2H_2O$$

$$2HF + SiF_4 \rightarrow \uparrow H_2SiF_6$$

As shown by the above formula, $F^-$ ion decreases as etching proceeds, and hydrogen ion concentration decreases as the solution becomes diluted by increased $H_2O$. As a result, in the subsequent etching processes the etching rate changes due to the unstable composition of the solution, which is significant drawback in obtaining uniformity and consequently a consistent reproducibility.

To maintain a constant etching rate and hydrogen ion concentration, ammonium fluoride ($NH_4F$) can be added into solution.

Ammonium fluoride dissociates into ammonium ion and fluoride ion, and the isolated fluoride ion participates in etching.

$$NH_4F \rightarrow NH_4 + F^-$$

The reduction of $F^-$ ion consumed during etching is compensated by adding ammonium fluoride, thus the concentration of hydrogen ion can be maintained to keep the etching rate constant. In the meantime, the ammonium ion does not affect the etching process.

As almost all wet enchants are isotropic (etching all directions in the vertical and horizontal directions), an undercut (which is formed by removing the portion where protected by the end portion of the photoresist film due to the horizontal etching) is made. Excessive undercut usually occurs in the wet etch to cause resist lifting. This is a drawback in wet etching and consequently it is difficult to use wet etching in manufacturing high integrated circuits having components with a small line-width.

On the other hand, single crystalline silicon and metal layers are etched after oxidizing, where nitric acid is used as oxidant. Here, single crystalline silicon is oxidized to form $SiO_2$, which is then etched by hydrofluoric acid. The mixed acid etchant (MAE) consisting $HNO_3$:$HF$:$CH_3COOH$ or $H_3PO_4$ in a ratio of 2:5:1:1 is conventionally used for etching silicon layers, where $CH_3COOH$ or $H_3PO_4$ is used to control the rapid and excessive reactions of $HNO_3$ and HF with silicon.

However, as such control is still not sufficient, single crystal silicon wafers are treated with $H_2SiF_6$ in its saturated concentration in the above mixed acid etchant solution. However, an exothermic reaction occurs in such mixed acid during etching, and the solution temperature increases by 20° C. in reaction time of 1~2 minutes, as the wafer is etched in a magnitude of approximately 30 micro-meters. As such, with the conventional enchants, the chemical activities which occurs during etching is still difficult to control, and as a result, they impart considerable etching damage on silicon wafers.

The reaction of the above conventional mixed acid etchant is described by the following.

$$Si + 4HNO_3 = SiO_2 + 4NO_{2(g)} + 2H_2O \quad (1)$$

$$SiO_2 + 6HF = H_2SiF_6 + 2H_2O \quad (2)$$

As shown by the following, the above formula 1 and 2 can be combined.

$$3Si + 4HNO_3 + 18HF = 3H_2SiF_6 + 4NO + 8H_2O \quad (3)$$

Additionally, another form of hydrofluoric acid, a buffered hydrofluoric acid (BHF), is also used for the etching silicon oxide layer. The reaction is described by the following.

$$4nHF + SiO_2 = SiF_4 + 2H_2O + nH^- + nF^- \quad (4)$$

$$2HF + SiF_4 = H_2SiF_6 \quad (5)$$

Also, for example, the heated HPM ($HCl/H_2O_2$), SPM ($H_2SO_4 + H_2O_2$) and aqua regia ($HCl + HNO_3$) are used to remove difficult to ionize heavy metals such as Fe, Cu, Au and Al, however, the formation of oxidation layer occurs on the wafer. For removing the oxidation layer, DHF ($HF + H_2O$) is used. Additionally, a mixed solution of $DHF + H_2O_2$ was developed to remove the metal such as Cu precipitated on the surface of wafers, which has a low tendency to ionize.

However, $H_2O_2$ easily decompose into $H_2O$ and $O_2$ so that it is easily consumed and HF readily volatilizes, making it difficult to maintain the homogeneity of the solution for etching and cleaning.

Further, silicon tetrafluoride (SiF4) generated from the above formula 4 reacts with $H_2O$ to produce colloidal silicon oxide ($SiO_2$) which readily adheres to the wafer surface, and having colloidal silicon oxide on the wafer surface leads to the formation of stains and contaminants.

Furthermore, although the etching rate is an important parameter for etching wafers, but for manufacturing high integrated circuits, the surface smoothness having a low level of roughness is an important requirement.

Also, as the etching process proceeds, colloidal silicon oxide and hydrogen fluorosilicate accumulate, causing a generation of large amount of waste water to be disposed. Hence, currently there is a need for solving disposal of waste water while prolonging the lifetime of the solution.

When LCD and semiconductor wafers have layers different from $SiO_2$ layer, such as $SiN_X$ (for example $Si_3N_4$), etching becomes a much more difficult process and requires a high concentration of HF, and further, it is difficult to apply photo resist film for a mask. Conventionally, 85% $H_3PO_4$ (at high temperature) and BOE by wet etching method is used for etching $SiN_X$ layer, but they may cause damage to substrates having additional $SiO_2$ layer, and as a result, it is difficult to obtain a fine and selective etching.

Alternatively, plasma etching which uses $CF_4+O_2$, $CH_3+O_2$, or SF can be used, however, as throughput is low in plasma etching, it is not feasible for mass production.

For etching Al and its alloys (example Al—Nb, Al—Ta), a mixed acid such as $H_3PO_4$ (65~72%)+$CH_3COOH$ (5~15%)+$HNO_3$ (5~8%)+deionized water (5~25%) is commonly used. Because $H_3PO_4$ is in the mixed acid at a high concentration, Al and mixed acid reacts to form bubble which is difficult to remove even after ultrasonic application, thus making it more difficult to obtain an uniform substrate surface.

SUMMARY OF THE INVENTION

In view of the foregoing, it is an object of the present invention to provide a cleaning and etching composition which would impart a minimum etching damage, a high level of smoothness and a high level of glossiness to quartz and glass substrates having silicon oxide as a main component during cleaning and etching process.

It is another object of the present invention to provides a cleaning and etching composition which would impart a minimum etching damage and a high level of smoothness to substrates having silicon as a main component during etching process.

It is yet another object of the present invention to provides a cleaning and etching composition which would impart a smooth surface to crystal glass substrates having silicon oxide, indium oxide or Pb2O3 during etching process.

In order to achieve the first object, the present invention provides a cleaning and etching composition comprising fluorides and persulfates as major components in aqueous solution for cleaning and etching substrates having silicon oxide as a main component. The composition may further comprise other constituents which do not have inherent effect on fluorides and persulfates.

The above fluorides dissociate into fluoride ion during cleaning and etching process which reacts with silicon. Persulfates decompose in the above aqueous solution to release hydrogen peroxide which increases the oxidation effect of fluorides and accelerates the reaction between fluoride ion and silicon.

According to the present invention, as needed, the composition may further include at least one selected from the group consisting of sulfonic acid and its salts having ability to decompose organic substances and to facilitate the etching effect of the above fluorides.

The composition according to the present invention can be effectively utilized for cleaning and etching substrates having silicon oxides as a main component such as quartz substrates and display panels made from glass, further, the composition can also be used to remove silicon oxide layer formed on the surface of substrates.

In order to achieve the second object, the present invention provides a composition comprising an inorganic acid solvent dissolved in water to be used as an accelerator for etching substrates having silicon as a main constituent. A nitrate and a fluoride are be dissolved in the above inorganic acid solvent.

The nitrate dissolved into the above solvent oxidizes silicon into silicon oxide, while dissolved fluoride releases fluoride ion which reacts silicon oxide, formed by the oxidation of silicon by nitrate, to generate fluoro-silicate.

In order to accomplish the third object, the present invention provides a composition comprising fluorides, oxalic acid/oxalic salts, sulfuric acid, or phosphoric acid or a mixture thereof for etching glass substrates.

The composition of the present invention can be safely and effectively used for cleaning display device substrates having silicon oxide as a main constituent and LCD substrates made from glass, without damaging the substrates. Further, the composition can also be used to etch silicon oxide and silicon layers with a desirable etching rate, making it possible to conveniently adjust various etching parameters during the etching process.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Figure 1:
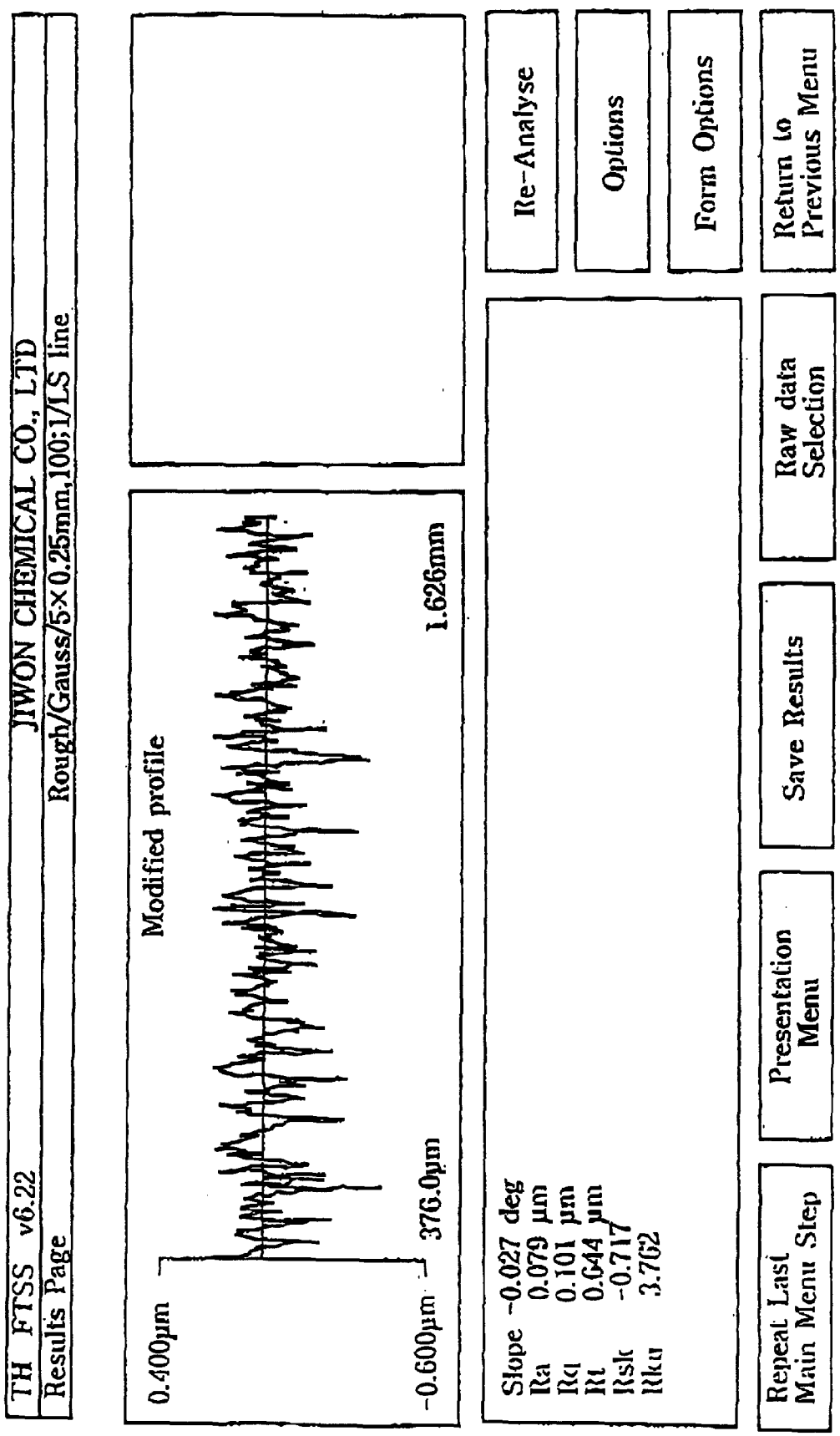
FIG. 1 is a graph showing a surface roughness of a semiconductor wafer after being etched by a conventional etchant composition of a mixed acid.

The present invention will now be described in detail below.

A cleaning and etching composition according to the present invention comprises fluorides, and during cleaning and etching substrates containing silicon oxide as a base material, fluorides dissociate and release fluoride ion which reacts with silicon.

Fluorides have a function of etching substrates with silicon oxide base material. Electronic display devices, quartz devices and semiconductor substrates are examples which comprise silicon oxide base material. Further examples of electronic display devices are cathode ray tube (CRT), vacuum fluorescent display (VFD), plasma display panel (PDP), electro-luminescent (EL) panel, and liquid crystal display (LCD).

Initial reaction of fluorides and silicon oxide is shown by below.

$$6XF+SiO_2=X_2SiF_6+2X_2O \text{ (wherein, X is a base)}$$

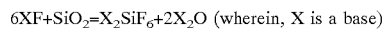

Fluorides dissociate and releases fluoride ion. Silicon oxide dissolves in fluoride ion, which reacts with silicon oxide to form fluor-silicate while proceeding with etching process.

Although, etching rate is lower for fluorides compared to conventionally used hydrofluoric acid, for the purpose of cleaning and to obtain smoothness, the etching rate is less significant. Etching rate of fluorides, however, can be easily adjusted to a desired rate by increasing its concentration.

For waste water disposal, it is much easier to dispose fluoride ions from fluorides compared fluorides from naturally occurring HF due to the coagulating factor, and fluoride ions resulting from the compositions of the present invention is drastically less then the fluoride ions from the hydrofluoric acid used in an conventional concentrations. Hence, fluoride ion waste is minimized thus decreasing the cost of waste disposal, while performing etching and cleaning process.

As example of a fluoride which can be used for the present invention, ammonium bifluoride ($NH_4HF_2$), ammonium fluoride ($NH_4F$), sodium fluoride (NaF), potassium bifluoride ($KHF_2$), barium fluoride ($BaF_2$), potassium fluoride (KF) and ammonium borofluoride ($NH_4BF_4$), etc may be mentioned. Preferably, ammonium bifluoride, ammonium fluoride, potassium bifluoride and potassium fluoride are preferably used, more preferably ammonium bifluoride. The fluorides can be used alone or in a mixture having at least two fluorides.

If an amount of fluoride is less than 0.8 g in one liter of aqueous solution, it takes a lengthy duration of time to clean substrates having silicon oxide as a main component, and if the amount exceed above 450 g in one liter of aqueous solution, an excessive amount of fluoride ion is generated and it becomes difficult to control and adjust the etching process and there is a risk of damaging silicon oxide layer. Accordingly, an amount of fluoride is in a range of from about 0.8 g to 450 g per one liter of aqueous solution, preferably, in a range of from about 8 g to about 350 g per one liter of aqueous solution, and more preferably, in a range of from about 30 g to about 120 g per one liter of aqueous solution.

The amount of fluorides is closely related to the etching rate of silicon oxide, more specifically, the etching rate is proportional to the amount of fluoride ion generated from the fluorides. For cleaning, the amount of fluorides is in a low concentration, and for etching the amount is in a high concentration. For cleaning, an amount of fluorides is in a range of from about 0.8 g to about 200 g per one liter of aqueous solution, preferably in a range of from about 5 g to about 120 g per one liter of aqueous solution, and for removing contaminated layer and for etching, the amount is in a range of from about 5 g to about 200 g per one liter of solution, preferably in a range of from about 10 g to about 120 g per one liter of aqueous solution.

A cleaning and etching composition according to the present invention comprises persulfates as a main component. When dissolved in aqueous solution, persulfates dissociate into hydrogen peroxide, which facilitates and increases the oxidation effect of the above described fluorides during cleaning and etching substrates having a silicon oxide base material.

Persulfates gradually decompose in aqueous solution, and at a high temperature they tend to decompose at a faster rate. In aqueous solution, persulfates decompose and dissociate into hydrogen peroxide in constant small amounts. Here, the generated hydrogen peroxide increases the oxidizing effect of fluoride ions generated from the fluorides. More, when hydrogen peroxide is generated in constant amounts, the oxidizing effect of fluoride ions tend to maintain in constant rate. Further, persulfates tend to protect the substrates to be treated from being attached by colloidal $SiO_2$ and fluorosilicates which are reaction products, hence substrates having silicon oxide layer can be cleaned without imparting damage to the surface.

As persulfates of the present invention, sodium persulfate, ammonium persulfate, potassium persulfate, etc. may be mentioned. Preferably, sodium persulfate and ammonium persulfate is preferably used, more preferably ammonium persulfate. The persulfates can be used alone or in a mixture having at least two persulfates.

If an amount of a persulfate is less than 0.8 g in one liter of aqueous solution, only a small amount of hydrogen peroxide is generated, and if the amount exceed above 450 g in one liter of aqueous solution, an excessive amount of hydrogen peroxide is generated and a large amount of fluorides is consumed, and products formed by the chemical reaction and solutes tend to crystalize. Accordingly, an amount of persulfate is in a range of from about 0.8 g to 450 g per one liter of aqueous solution, preferably, in a range of from about 8 g to about 350 g per one liter of aqueous solution, and more preferably, in a range of from about 10 g to about 240 g per one liter of aqueous solution.

Because persulfates increases the oxidizing reaction, it is appropriate to increase or decrease its concentration according to the types of substrate to be treated. For cleaning, an amount of persulfates is in a range of from about 1 g to about 550 g per one liter of aqueous solution, preferably in a range of from about 10 g to about 240 g per one liter of aqueous solution, and for removing contaminated layer and for etching, an amount should be in a range of from about 5 g to about 550 g per one liter of solution, preferably in a range of from about 10 g to about 240 g per one liter of aqueous solution.

A cleaning and etching composition according to the present invention can optionally comprise sulfonic acid, its salts or a mixture thereof. Sulfonic acid, its salts and its mixtures has $SO_2/SO_3$ group, and they function to decompose organic substances and enhance fluorides etching ability. Accordingly, the above cleaning and etching composition which includes sulfonic acid, its salts or a mixture thereof can be effectively applied for etching display funnels having graphite layers which contains polymers such as acryl or styrene resin.

As sulfonic acid and its salts of the present invention, sulfamic acid, sulfosalicylic acid dihydrate, ammonium sulfamate, sulfonyl amide, sodium sulfosalicylate, etc. may be mentioned. Preferably, sulfamic acid or ammonium sulfamate is used, and more preferably sulfamic acid. Sulfonic acid and its salts can be used alone or in a mixture thereof.

At a higher concentrations of sulfonic acid/its salts, the decomposition of organic substances increases, and the amount of sulfonic acid/its salts to be added determined by considering the solubility of sulfonic acid/its salts at a room temperature due to the effects from the bivalent ions of the composition. An amount of sulfonic acid/its salts need to be adjusted (increased or decreased) within in a range of from about 0.8 percent by weight to about 40 percent by weight depending on the amount and types organic substances on the substrates to be treated.

If an amount of sulfonic acid, its salts or a mixture thereof is less than 8 g in one liter of aqueous solution, their decomposing ability becomes weak, and if the amount exceed above 350 g in one liter of aqueous solution, they do not readily dissolve into the composition solution. Accordingly, an amount of sulfonic acid, its salts or a mixture thereof is in a range of from about 8 g to 350 g per one liter of aqueous solution, preferably, in a range of from about 40 g to about 120 g per one liter of aqueous solution.

As needed, a cleaning and etching composition according to the present invention for cleaning and etching substrates having a silicon oxide base material may further comprises an alcohol.

Alcohols have an effect of decomposing and dissolving organic substances, and prior to being added, their characteristics in aqueous solution need to be considered. The amount to be added needs to be adjusted (increased or decreased) depending on the amount and types of organic substances to be removed from the surface of substrates to be treated, and another factor to be considered is accumulation of COD which is generated during cleaning and after etching processes.

If an amount alcohols is less than 2 percents by volume in one liter of cleaning and etching composition solution, their decomposing ability for organic substances becomes weak, and if the amount exceed above 30 percents by volume in one liter of composition solution, they have a tendency to readily volatilize. Accordingly, an amount of alcohols should be in a range of from about 2 percents by volume to 30 percents by volume in one liter of composition solution, preferably, in a range of from about 5 percents by volume to about 20 percents by volume in one liter of composition solution.

Alcohols used in the present invention is alcohols having less than six carbon atoms, preferably isopropyl alcohol.

Inhibitors and accelerators can be used when appropriated by cleaning and etching processes. The amount of inhibitors and accelerators to be added to depends on the following factors: characteristics and requirements of each process, cost, cleaning effectiveness and etching rate. Surfactants can be added to the composition to decrease surface tension.

After mixing the above described fluorides, sulfonic acid/ its salts or persulfates into a composition, the composition can be formulated into a solute for transportation and storage. Prior to use, the composition may be dissolved into a purified water or deionized water and Surfactants, alcohols, inhibitors and accelerators may further be added into a liquified solution.

Surfactants decrease surface tension of the cleaning and etching composition of the present invention to enhance its penetrating ability. As an example of surfactants surfactants comprising Na or $SO_3^-$, such as sodium diphenyl sulfosuccinate may be mentioned. The amount of surfactant is in a range of from about 0.1 g to about 20 g per one liter of the composition, preferably from about 1 g to about 10 g per one liter of the composition.

Depending on a type of a layer to be removed, inhibitors are selected and used for removing layers formed on top of a metal without damaging the metal itself. Example of inhibitors include amine and amides. The amount of inhibitors is in a range of from about 0.01 percent by weight to about 10 percent by weight, preferably from about 0.1 percent by weight to about 3 percent by weight.

For the reaction accelerator, sulfuric acid, phosphoric acid, or acetic acid can be selectively used. The amount of accelerators is in a range of from about 0.05 percent by weight to about 20 percent by weight, preferably from about one percent by weight to about 10 percent by weight.

A cleaning and etching composition of the present invention for cleaning and etching substrates having silicon as a base material comprises: an inorganic acid dissolved in water in form of a solvent having an acid concentration range of from about 35% to about 93%; a nitrate dissolved in the above solvent in a concentration range of from about 1 g/L to about 450 g/L for oxidizing silicon; and a fluoride dissolved in the above solvent in a concentration range of from about 1 g/L to about 450 g/L for reacting with the above silicon oxide to release fluoride ion to consequently produce fluoro-silicate.

The following two formula shows the reactions of cleaning and etching composition comprising a nitrate, fluoride or sulfuric acid with the substrates having silicon based materials.

$$H_2SO_4+2NH_4NO_3+2Si=2SiO_2+2NO+(NH_4)_2SO_4+H_2 \quad (6)$$

$$H_2SO_4+6NH_4HF_3+2SiO_2=2(NH_4)_2SiF_6+(NH_4)_2SO_4+4H_2O \quad (7)$$

The above formulas 6 and 7 can be combined as shown by the following.

$$2H_2SO_4+2NH_4NO_3+6NH_4HF_3+2Si=2(NH_4)_2SiF_6+2(NH_4)_2SO_4+ \\ 2NO+4H_2O+H_2 \quad (8)$$

For etching substrates having silicon based material, the following shows a comparison between formulas (1) to (3), which show reactions of conventionally used MAE, and formulas (6) to (8) which shows reactions of the cleaning and etching composition as described by the above.

First, NO and water are less generated in the present invention than in the conventional MAE etchant. When conventional MAE etchant is used, there is a problem of generating water during the etching process, as a result, its etching ability decreases and consequently the etchant must be discarded or replaces. Whereas, a cleaning and etching composition of the present invention generate less water compared to MAE etchant, thus decrease of its ability is minimized.

Second, conventional MAE etchant produce a toxic $H_2SiF_6$ reaction product, which is an acid. A cleaning and etching composition of the present invention generate comparatively safe $(NH_4)_2SiF_6$, which is a salt.

Third, when the water content exceed certain level in the conventional MAE etchant, the etching comes to a cease, this is attributed by Si being hydrophobic in nature, and as a result, it is difficult for etching solution to come in contact with Si layer surface. In this respect, a cleaning and etching composition of the president invention is similar to the conventional MAE etchant. Consequently, for the conventional MAE there is a drawback in that when water is added to decrease an excessive reaction, the reaction comes to an end, and during reaction water is generated to render the etchant ineffective. Conventionally, to control the reaction rate for MAE, acetic acid or phosphoric acid is added to an etchant solvent having a nitric acid and hydro fluoric acid, or a method of saturating the MAE etchant with $H_2SiF_6$ (reaction product) prior to etching have been implemented. For example, when etching silicon wafers, a dummy wafer is firstly treated with the conventional etchant to accumulate $H_2SiF_6$, then the real silicon wafer is etched with the etchant having accumulated $H_2SiF_6$.

A composition of the present invention has three constituents which participate in the reaction with Si layer, in addition, by adjusting the concentrations of nitrates, fluorides, sulfuric acid and or phosphoric acid, the etching rate for silicon substrates can be flexibly controlled.

Fourth, because the compositions of the present invention is comprised of salts and or non-volatile inorganic acids all of which participate in actual etching reactions, a very few constituents is ever released. In contrast, HF and HNO3 from the conventional MAE tend to be easily released into the air without even participating in the etching reactions.

The above formulas (6) to (8) of the present invention is based on having sulfuric acid in the reactant. In the case of having phosphoric acid, the reaction product would be ammonium phosphate instead of ammonium sulfate.

Generally, a highly concentrated sulfuric acid is dangerous, since it leaves a significant skin damage, however, for the present invention a 50% sulfuric acid which causes a relatively insignificant skin injury is utilized. Although, there were many occasions where the present inventor had skin contact with 50% sulfuric acid, there were no apparent problems with the safety. Further, phosphoric acid is even more safer to use in terms of being susceptible to chemical harm, and the resulting reaction products are also comparatively safe chemicals.

However, compared to the conventional MAE the composition of the present invention comprises an acid which has a high viscosity. To resolve this problem, a surfactant which is safe in strong acid can be selected according to the types of substrates to be etched, and added into the composition to decrease viscosity and surface tension.

As described earlier, nitrates have the function of oxidizing silicon layer. As nitrates which can be used in the present invention, sodium nitrate, ammonium nitrate, potassium nitrate, barium nitrate, etc. may be mentioned. Preferably, sodium nitrate and ammonium nitrate is used, more preferably ammonium nitrate. The nitrates may be used alone or in a mixture having at least two nitrates.

If an amount of a nitrate is less than 1 g/L in one liter of total composition solution, the reaction which produces silicon oxide from silicon is insufficient, and if the amount exceed above 450 g/L in one liter of total composition solution, an excessive amount of silicon oxide is generated. Accordingly, an amount of nitrates is in a range of from about 1 g/L to 450 g/L per one liter of composition solution, preferably, in a range of from about 3 g/L to about 350 g/L per one liter of composition solution, and more preferably, in a range of from about 30 g/L to about 280 g/L per one liter of composition solution.

Fluorides reacts with silicon oxide produced from nitrate and silicon to generate fluoro-silicate. As examples of a fluoride which can be used for the present invention, ammonium bifluoride ($NH_4HF_2$), ammonium fluoride ($NH_4F$), sodium fluoride (NaF), potassium bifluoride ($KHF_2$), sodium bifluoride ($NaHF_2$), barium fluoride ($BaF_2$), potassium fluoride (KF), ammonium borofluoride ($NH_4BF_4$), etc. may be mentioned. Preferably, ammonium bifluoride, ammonium fluoride, potassium bifluoride and potassium fluoride is used, more preferably ammonium bifluoride. The fluorides can be used alone or in a mixture having at least two fluorides.

If an amount of a fluoride is less than 1 g/L in one liter of total composition solution, the reaction with silicon oxide becomes insufficient weak, and if the amount exceed above 450 g/L in one liter of total composition solution, the reaction exceeds beyond a desirable level and solubility decreases. Accordingly, an amount of fluorides is in a range of from about 1 g/L to about 450 g/L per one liter of composition solution, preferably, in a range of from about 2 g/L to about 300 g/L per one liter of composition solution, and more preferably, in a range of from about 20 g/L to about 180 g/L per one liter of composition solution.

If a composition ratio of nitrates and fluorides is lower than 1:9, an amount of silicon needed to form silicon oxide is not sufficient, and if a composition ratio is higher than 9:1, the reaction for forming fluoro-silicate from silicon oxide becomes ineffective. Accordingly, a composition ratio of nitrates and fluorides is in a range of from about 1:9 to about 9:1, preferably, in a range of from about 3:7 to about 7:3.

A solvent of the present invention is a inorganic acid solvent comprising sulfuric acid, phosphoric acid or a mixture thereof. Here, an inorganic acid is needed to initiate etching reaction. Because silicon is hydrophobic, when water content exceed above a certain level the etching reaction comes to a cease. When a conventional mixed acid etchant composition, commonly comprising nitrate (70%), HF (50%) and acetic acid (100%), mixed in a ratio of 2.5:1:1, is mixed in water in a ratio of 2:1 for etching silicon substrates, the etching reaction fails to initiate. This is attributed by hydrophobicity of silicon substrate. Similarly, no etching reactions occur when the water content in the composition of the present invention exceed above a certain level.

If the acid solvent concentration is lower than 35%, no reactions will occur due to the large amount of water present, and if the acid solvent concentration is higher than 93%, the amount of fluorides and nitrates to be dissolved into a composition solution becomes limited. Accordingly, an acid solvent concentration should be in a range of from about 35% by volume to about 93% by volume %, preferably, in a range of from about 40% by volume to about 70% by volume.

When sulfuric acid is used, an acid solvent concentration is in a range of from about 35% by volume to about 93% by volume, preferably, in a range of from about 45 % by volume to about 65% by volume, and when phosphoric acid is used, an acid solvent concentration is in a range of from about 55% by volume to about 82% by volume, preferably, in a range of from about 65% by volume to about 75% by volume.

In preparing an etching composition of the present invention, nitrates and fluorides are dissolved in purified water in saturated concentrations, then added into an inorganic acid solvent. Nitrates and fluorides are added into the inorganic acid solvent in an amount from a minimum concentration required to initiate a reaction of 3 g/L to their saturated concentrations. An amount of nitrates and fluorides is added into the inorganic acid solvent in a range of from about 3 g/L to about 480 g/L, preferably, in a range of from about 30 g/L to about 360 g/L.

The amount to be used in a composition is appropriately adjusted depending on the etching rate required for its respective processes. For example, to uniformly etch a single crystalline wafer without initiating a exothermic reaction, an amount of from about 50 g/L to about 150 g/L is used.

A composition of the present invention to be used for etching silicon substrates may optionally include a surfactant to decrease its surface tension. A surfactant is selected based on its ability to decrease surface tension considerably relative to the amount of utilized and its stability under heat, such as fluoro-carbon type surfactants, for example, tetraethyl fluoroalkyl sulfonate.

A composition of the present invention to be used for etching single crystalline wafers does not initiate a exothermic reaction during etching nor impart etching damages. Further, in contrast to the conventional MAE, because an uniformed surface roughness can be obtained, after etching, subsequent polishing step can be eliminated or the time consumed in the polishing step can be drastically reduced.

A composition of the present invention to be used for etching crystal glass substrates comprises fluorides, oxalic acid/its salts.

Generally, crystal glass comprises lead oxide ($Pb_2O_3$) as one of its constituents in addition to silicon dioxide which is a main component, and during etching in high temperatures $Pb_3O_4$ and PbO are generated from the lead oxide, which then reacts with oxalic acid and its salts. Oxalic acid and its salts have an additional role of preventing fluoro-silicate and colloidal silicon oxide from attaching to the surface of the substrates to be treated. As oxalic acid and its salts, sodium oxalate, ammonium oxalate monohydrate, potassium oxalate monohydrate, potassium trihydrate dioxalate dihydrate, etc. may be mentioned. These oxalic acids and salts can be used alone or in a mixture of two or more.

Fluorides which can be used in present invention have been described above.

A composition ratio of fluorides and oxalic salts by weight is from about 1:9 to about 9:1, preferably, from about 3:7 to about 7:3. The composition can be added to sulfuric acid, phosphoric acid or a mixture thereof at acid concentration of from about 30% to about 90%, preferably, from about 40% to about 70%.

The composition ratio of oxalic acid and or fluorides is determined by the amount of lead oxide in crystal glass.

A composition of the present invention is carried out by dipping substrates into the composition. More, utilization of the composition of the present invention can reduce processing time required or eliminate the conventionally utilized steps of bubbling, mechanical vibration, agitating, ultrasonic and centrifuge processes which may be required for dipping process. Further, to enhance the effectiveness of a composition of the present invention, device type, temperature, pressure, composition ratio, composition concentration, flow rate, vibration, ultrasonic, mechanical agitation, dipping or spraying, or bubbling processes can be implemented as appropriated, and as such, the composition of the present invention can be carried out in various processes and methods, such as mechanical polishing and rubbing/buffing methods.

According to the present invention, by utilizing salts instead of pure nitric or hydrofluoric acids, the life span of the composition can be extended, while an effective waste water disposal and uniformed reproducibility of the composition during continuous use can be realized.

EXAMPLES

The preferred embodiments of the present invention will be described in detail below. The following examples are provided to further illustrate the invention and are not intended to limit the scope of the present invention.

Examples 1–4 and Comparative Examples 1–5

For Examples 1–4 and Comparative Examples 1–5, compositions for cleaning substrates having silicon oxide as a main constituent were prepared by dissolving the compounds shown in the following table 1 into a purified water.

Commercially available ammonium bifluoride, ammonium persulfate and hydrofluoric acid were utilized.

TABLE 1

| Compound | $NH_4HF_2$ (g/1 liter of purified water) | $(NH_4)_2S_2O_8$ (g/1 liter of purified water) | HF (g/1 liter of purified water) |
| --- | --- | --- | --- |
| Example 1 | 40 | 120 | — |
| Example 2 | 120 | 40 | — |
| Example 3 | 120 | 120 | — |
| Example 4 | 1 | 1 | — |
| Comparative Ex. 1 | 0.5 | 0.5 | — |
| Comparative Ex. 1 | 1 | 550 | — |
| Comparative Ex. 3 | 500 | 1 | — |
| Comparative Ex. 4 | — | — | 5 |
| Comparative Ex. 5 | — | — | 150 |

Cleaning Test I

The following test pieces with a dimension of 30 mm×30 mm were prepared: a surface glass substrate for depositing graphite or fluorescent layer to the inner side of a cathode ray tube panel; a bare glass substrate for fabricating LCD substrate; quartz substrate; and quartz substrate having contaminated with foreign particles (polymer having silicon, fluoride and carbon atoms). Contaminants were removed by dipping the test-pieces into the compositions of Examples 1–4 and Comparative Examples 1–5.

As water will form uniformly on the surfaces of the test-pieces, if there are no remaining contaminants, the completion of cleaning was verified by observing the hydrophilicity of the test-pieces. If there are remaining contaminants, water on the surfaces of the test-pieces will break. Cleaning times were measured and shown in table 2 below.

TABLE 2

| Cleaning time (second) | LCD bare glass | CRT panel glass | Quartz substrate | Quartz substrate (contaminated) |
| --- | --- | --- | --- | --- |
| Example 1 | 5 | 10 | 8 | 120 |
| Example 2 | 5 | 10 | 8 | 120 |
| Example 3 | 3 | 8 | 8 | 110 |
| Example 4 | 30 | 60 | 60 | 1800 |
| Com. Ex. 1 | 180 | 450 | 420 | above 3600 |
| Com. Ex. 2 | 1 | 4 | 4 | above 3600 |
| Com. Ex. 3 | 1 | 3 | 8 | 300 |
| Com. Ex. 4 | 40 | 400 | 300 | above 3600 |
| Com. Ex. 5 | 1 | 1 | 4 | 300 |

As shown by the above table 2, the compositions of Examples 1–4 performed cleaning less than one minute for LCD bare glass, CRT panel glass and quartz substrates. However, when a small amounts of ammonium bifluoride and ammonium persulfate are used, as in Comparative Example 1, the cleaning time was determined to be considerably long.

When the amount of either ammonium bifluoride or ammonium persulfate was excessively high or low, the cleaning time was too brief to control the process.

The compositions of Examples 1–3 were determined to be suitable, as they took within 2 minutes to clean contaminated quartz substrate.

The amount of foreign particles formed on LCD glass substrates differs from the amount formed on CRT glass substrates as differentiated by their respective manufacturing processes. Similarly, for quartz substrates and contaminated quartz substrates which have different particles to be removed, the cleaning process must also differ.

In this regard, the cleaning composition must be adjusted appropriately according to the types of silicon oxide substrates to be treated and the statuses of their surfaces.

As it can be seen from table 2, for cleaning contaminated quartz substrates, the compositions of Examples 1–3 were found to be suitable, while the compositions from Example 4 and Comparative Examples 1–5 were determined to be unsuitable, since the cleaning times were extensively long to be satisfactory. For the compositions of Comparative Examples 1, 2 and 4, no cleaning was observed.

The compositions of Examples 1–4 and Comparative Examples 1–3 having ammonium persulfate and ammonium bifluoride, during cleaning, left no surface damage to LCD bare glass and CRT panel glass substrates having glass as their main constituent. In contrast, surface damages were observed for hydrofluoric acid.

Surface Damage Test

The following test pieces were prepared: a surface glass substrate as described earlier; a bare glass substrate for fabricating LCD substrate; quartz substrate; and quartz substrate having contaminated with foreign particles (polymer having silicon, fluoride and carbon atoms). Contaminants were removed by dipping the test-pieces into the compositions of Examples 1–4 and Comparative Examples 1–5. Glass substrates and quartz substrates were all treated for five minutes. Substrates were observed for surface damages and the results are shown in table 3 below.

TABLE 3

| | LCD bare glass | CRT panel glass | Quartz substrate | Quartz substrate (contaminated) |
|---|---|---|---|---|
| Example 1 | none | none | none | none |
| Example 2 | none | none | none | none |
| Example 3 | none | none | none | none |
| Example 4 | none | none | none | not cleaned |
| Com. Ex. 1 | none | not cleaned | none | none |
| Com. Ex. 2 | none | none | none | none |
| Com. Ex. 3 | severe damage | severe damage | severe damage | severe damage |
| Com. Ex. 4 | severe damage | not cleaned | severe damage | not cleaned |
| Com. Ex. 5 | severe damage | severe damage | severe damage | severe damage |

As it can be noted from the above table 3, no surface damages were seen for the compositions of Examples 1–4, and the compositions of Comparative Examples one and 2 also left no surface damages due to the small amount of ammonium bifluoride in the compositions. The composition of Comparative Example 3 left surface damage. As its persulfate content amount is drastically less than the amount of fluoride content, fluoro-silicates generated during cleaning process have attached to the surfaces of the substrates to impart damage.

Comparative Examples 6 and 7

Conventionally used 10% and 20% hydrofluoric acid solutions were prepared by using commercially available hydrofluoric acid.

Cleaning Test II

Various types of CRT test-pieces having 14 inch panel size were prepared.

Types of Test-Piece Panel

A: panel prior to inner-black coating

B: defective inner-black coated panel (to be refabricated)

C: defective fluorescent layer panel (to be refabricated)

Utilizing a spray device having 5 m water head pressure and 20 mm nozzle diameter, 500 ml of the respective compositions of Example 1 and Comparative Examples 6 and 7 were sprayed on the panels at a distance of 20 cm from the nozzle head at 25° C. The cleaning times were measured until water has formed uniformly on the surfaces of the test-piece panels to determine the cleaning abilities of the compositions. The results are shown by the below table 4.

TABLE 4

| Composition | Test-piece panel | Time (sec.) | Cleaning result |
|---|---|---|---|
| Example 1 | A | 4 | hydrophilic |
| Comparative Ex. 6 | A | 6 | hydrophilic |
| Example 1 | B | 6 | hydrophilic |
| Comparative Ex. 6 | B | 9 | hydrophilic |
| Example 1 | C | 8 | hydrophilic |
| Comparative Ex. 7 | C | 12 | hydrophilic |

As it can be noted from the above table 4, cleaning times were faster for the composition of Example 1 compared to the compositions of Comparative Examples 6 and 7 which comprise conventionally used hydrofluoric acid.

Example 5

A cleaning composition were prepared by adding 5 g of commercially available sodium dihexyl sulfosuccinate as a surfactant to one liter of solution comprising the composition of Example 1.

Gloss Value and Water-Wettability Test

The following test-piece D was prepared.

D: defective outer coated industrial panel (to be reclaimed)

The outer face of the test-piece D was polished by using conventional method utilizing cerium oxide at a polishing pressure of 4kg/cm$^2$, while another test-piece D was cleaned manually by hand with polyethylene pad having the composition of Example 5 at a polishing pressure of 0.5kg/cm$^2$ or less. The gloss value and water-wettability of the test-pieces were measured and compared with a normal fresh panel product, as shown by the below table 5.

TABLE 5

| | Gloss value | Water-wettability |
|---|---|---|
| Normal fresh panel | 97.25% | hydrophobic |
| Test-piece panel D polished with CeO$_2$ | 96.4% | hydrophobic |
| Test-piece panel D cleaned by composition of Example 5 | 97.25% | hydrophilic |

As it can be noted from the above table 5, the test-piece D cleaned with the composition of Example 5 had a high gloss value same as the normal fresh panel, while the gloss value of the test-piece D polished with conventional cerium oxide was measured to be less than the normal fresh panel. Further, as both normal fresh panel and test-piece panel D polished with cerium oxide exhibited hydrophobicity, it can be determined that there is a presence of foreign particles still remaining on their surfaces. In contrast, the test-piece D cleaned with the composition of Example 5 showed hydrophilicity as uniformed water film was formed on its surface, thus the composition of Example 5 was determined to remove coating defects caused by foreign particles.

More, polishing with conventional cerium oxide leaves scratches which cause a sparking defect, and this can lead to a greater subsequent possibility of having defective panels during the re-coating process; as in the manufacture of color display tubes CDT, defective panels are diverted to a lower grade color picture tubes CPT, bringing a substantial loss to the manufacturing process. On the other hand, the composition of Example 5 leaves no scratches, and as a result re-manufacture of normal fresh panel products can be realized.

Example 6

A cleaning solution was prepared by diluting the composition of Example 5 with water in 5 dilutions (composition of Example 5: water=2:8).

LCD Substrate Cleaning Test

A LCD bare glass test-piece having a dimension of 50 mm×50 mm×0.7 mm was prepared. A diluted hydrofluoric acid solution (in 1:100 water ratio) conventionally used for cleaning silicon oxide substrates and a cleaning solution having the composition of Example 6 were utilized to clean the test-piece. The test-piece was dipped into the respective solutions at 25° C. and agitated. The water-wettability and cleaning times were observed and measured, as shown by table 6 below.

TABLE 6

|  | Composition of Ex. 6 | Diluted HF solution |
|---|---|---|
| Amount of fluoride ion present (ppm) | 532 | 4748 |
| Dipping time (sec.) | 3 | 40 |
| Water-wettability | hydrophilic | hydrophilic |

As it can be seen from table 6, the cleaning ability of the composition of Example 6 was determined, as the hydrophilicity of the test-piece being treated was established within much shorter time. The cleaning composition of Example 6 having a small amount of fluoride ion present also showed an effective cleaning ability and left a minimum surface damage.

Treatment of LCD substrate having silicon nitride layer ($SiN_x$) and aluminum alloy (Al—Nb) layer.

LCD substrate test pieces with a dimension of 50 mm×50 mm×0.7 mm having a silicon nitride layer with a thickness of 3000 angstroms, and LCD substrate test pieces with a dimension of 50 mm×50 mm×0.7 mm having aluminum alloy layer with a thickness of 2500 angstroms were prepared.

Example 8

A buffered oxide etchant (BOE) conventionally used for etching silicon oxide substrates was prepared by mixing 40% $NH_4F$ and 50% HF in a ratio of 20:1.

Example 9

An etchant solution conventionally used for etching aluminum was prepared by mixing 65% by weight of phosphoric acid, 5% by weight of acetic acid, 5% by weight of nitric acid and 25% of water.

LCD substrate test pieces having a silicon nitride layer were dipped into the respective composition solution of Examples 1 and 5 and Comparative Example 8 at a temperature of 25° C. for a certain duration of time, and LCD substrate test pieces having aluminum alloy layer were dipped into the respective composition solution of Examples 1 and 5 and Comparative Example 9 at a temperature of 25° C. for a certain duration of time. Etching times for the substrate pieces were measured and shown in the below table 7.

TABLE 7

|  | Composition | Etching time (sec.) |
|---|---|---|
| Substrates having silicon nitride layer | Example 1 | 120 |
|  | Example 5 | 90 |
|  | Comparative Example 8 | 180 |
| Substrates having aluminum alloy layer | Example 1 | 360 |
|  | Example 5 | 360 |
|  | Comparative Example 9 | 360 |

The compositions of Examples 1 and 5 etched the substrates in a relatively short duration of time, and compared to the conventional etchants which are used for etching substrates having a silicon nitride layer or substrates having an aluminum alloy layer, the etching rate showed no significant difference. Further, the cleaning compositions of the Examples 1 and 5 had no corrosive effect on the substrates, and it was determined that the compositions can be used suitably as an etchant for etching substrates having silicon nitride layers and aluminum alloy layers.

Example 7–10

Solutions having the compositions shown in the following table 8 were prepared for Examples 7–10.

TABLE 8

|  | Fluoride composition | Persulfate composition |
|---|---|---|
| Example 7 | KF 40 g/1 liter of deionized water (D.I.W) | $(NH_4)_2S_2O_8$ 120 g/one liter of D.I.W. |
| Example 8 | $KHF_2$ 40 g/one liter of D.I.W | $(NH_4)_2S_2O_8$ 120 g/one liter of D.I.W. |
| Example 9 | $NH_4HF_2$ 40 g/one liter of D.I.W | $K_2S_2O_8$ 120 g/one liter of D.I.W. |
| Example 10 | $NH_4HF_2$ 40 g/one liter of D.I.W | $Na_2S_2O_8$ 120 g/one liter of D.I.W. |

Cleaning Test III

The following test pieces with a dimension of 30 mm×30 mm were prepared: a surface glass substrate for depositing graphite or fluorescent layer to the inner side of a cathode ray tube panel; a bare glass substrate for fabricating LCD substrate; quartz substrate; and quartz substrate having contaminated with foreign particles (polymer having silicon, fluoride and carbon atoms). Contaminants were removed by dipping the test-pieces into the compositions of Examples 6–10.

If there are no remaining contaminants, water will form uniformly on the surfaces of the test-pieces, hence the completion of cleaning was verified by observing the hydrophilicity of the test-pieces. If there are remaining contaminants, water on the surfaces of the test-pieces will break. Cleaning times were measured and shown in table 9 below.

TABLE 9

| Cleaning time (second) | LCD bare glass | CRT panel glass | Quartz substrate | Quartz substrate (contaminated) |
|---|---|---|---|---|
| Example 7 | 7 | 18 | 12 | 200 |
| Example 8 | 6 | 15 | 10 | 180 |
| Example 9 | 7 | 18 | 12 | 210 |
| Example 10 | 10 | 20 | 15 | 240 |

As it can be noted from table 9, the compositions of Examples 7 and 8 took 1.5 times longer, compared to the composition of Example 1, to etch substrates having silicon oxide as a main constituent. Still, the etching time is well within the satisfactory level to be applied in the manufacturing process.

Conventionally, for etching substrates having silicon oxide layer as a main constituent, hydrofluoric acid has been used. According to the characteristics of the silicon oxide layer to be etched or removed, hydrofluoric acid has been used in a different concentrations in solution, for example 100:1 ratio (5 g/one liter of solution for 50% HF), or in some cases, 50% HF solution alone has been utilized as needed. In this respect, similar to the broad range of HF concentration conventionally utilized, the compositions of the present invention may also be used in a wide range of concentrations for etching a diverse types of substrates.

As it can be clearly seen in the above experiment, when the cleaning composition of the present invention comprises a mixture of fluorides and persulfates, the cleaning composition attaches to the surface of the substrates and initiates an uniform etching to enhance the cleaning ability of the composition. Consequently, the cleaning composition, in addition to its cleaning purpose, can be effectively used for etching and patterning processes.

As needed, the cleaning composition can be added with a surfactant to increase its penetrating ability.

Examples 11–15

Compositions comprising the components shown in the below table 10 were prepared for Examples 11–15. The compositions of Examples 11–15 were used to etch LCD bare glass substrate.

Commercially available ammonium bifluoride and sodium persulfate were utilized. The results of etching is shown below by table 10.

TABLE 10

| Compound | $NH_4HF_2$ (g/one liter of purified water) | $(NH_4)_2S_2O_8$ (g/one liter of purified water) | Etching rate (angstroms/min.) |
|---|---|---|---|
| Example 11 | 10 | 120 | 50 |
| Example 12 | 40 | 120 | 100 |
| Example 13 | 80 | 120 | 250 |
| Example 14 | 120 | 240 | 550 |
| Example 15 | 240 | 240 | 1000 |

As it can be seen from the above table 10, the etching rate is related to the amount of fluorides present. The hydrogen peroxide released from sodium persulfate has accelerated the fluorides etching rate. The persulfate also prevented the attachment of fluoride-silicates.

Examples 16–23 and Comparative Examples 10–12

Cleaning compositions for cleaning substrates having silicon oxide as a main component, having components shown in table 11 below, were prepared by using purified water for Examples 16–23 and Comparative Examples 10–12.

Commercially available ammonium bifluoride, sodium persulfate, sulfamic acid and hydrochloric acid were used.

TABLE 11

| Compound | $NH_4HF_2$ (g/1 liter of purified water) | $(NH_4)_2S_2O_8$ (g/one liter of purified water) | $NH_2SO_3H$ (g/one liter of purified water) | HF (g/1 liter of purified water) |
|---|---|---|---|---|
| Example 16 | 120 | 80 | 40 | — |
| Example 17 | 40 | 120 | 80 | — |
| Example 18 | 80 | 40 | 120 | — |
| Example 19 | 80 | 80 | 80 | — |
| Example 20 | 10 | 10 | 300 | — |
| Example 21 | 300 | 10 | 10 | — |
| Example 22 | 10 | 300 | 10 | — |
| Example 23 | 10 | 10 | 10 | — |
| Com. Ex. 10 | 5 | 5 | 5 | — |
| Com. Ex. 11 | — | — | — | 200 |
| Com. Ex. 12 | — | — | — | 100 |

CRT Bulb Funnel Refabrication Test 15 inch CRT bulb funnels having inner and outer graphite coating for refabrication were prepared. The bulb funnels were dipped into the compositions of Example 16–23 and Comparative Examples 10–12 at 25° C. to remove graphite layers. Removal times were measured and surface status of the eroded bulb funnels were observed. The results are shown by table 11 below.

TABLE 12

|  | Removal time (sec.) | Surface status |
|---|---|---|
| Example 16 | 50 | Satisfactory |
| Example 17 | 80 | Satisfactory |
| Example 18 | 70 | Satisfactory |
| Example 19 | 50 | Satisfactory |
| Example 20 | 300 | Satisfactory |
| Example 21 | 150 | Average |
| Example 22 | 300 | Satisfactory |
| Example 23 | 400 | Satisfactory |
| Comparative Example 10 | 1200 | Satisfactory |
| Comparative Example 11 | 50 | Defective |
| Comparative Example 12 | 120 | Defective |

As shown in table 12, the removal times of the compositions of Examples 16–19 were similar to the compositions of Comparative Examples 11 and 12 having conventional hydrofluoric acid, and hence their applicability was determined to be suitable.

The composition of Examples 20, 22 and 23 having small content of fluorides imparted satisfactory surface status due to a small erosion for glass substrates, however, graphite layer removal times were substantially long. On the other hand, the composition of Example 21 having a large content of fluorides exhibited satisfactory removal time, but left fluoro-silicates on the surfaces of glass substrates.

The composition of Comparative Example 10 took extensively long time to remove graphite layer due to the extremely low fluoride content in the composition, rendering the composition unsuitable for practical applications.

Although, the compositions of Comparatives Examples 11 and 12 having conventionally utilized hydrofluoric acid removed the graphite layers in satisfactory time, hydrofluoric acids had severely eroded the glass substrate and left a rough abrasion to the degree where it would be difficult to coat a graphite layer during the refabrication process, due to the decreased adhesiveness of the graphites for the glass surface. Consequently, for the surface treatment process required for the refabrication process, conventionally utilized hydrofluoric acid of Comparative Examples 11 and 12 were found to be unsuitable in comparison with the compositions of the present invention.

As determined by the above results, in an aqueous solution, an amount of fluorides is from about 9 to about 220 g/L, preferably, from about 35 to about 150 g/L; an amount of persulfates should be from about 9 to about 220 g/L, preferably, from about 35 to about 150 g/L; and an amount of sulfamic acid should be from about 9 to about 220 g/L, preferably, from about 35 to about 150 g/L.

Examples 24–31 and Comparative Examples 13–36

Cleaning compositions having compounds shown in the below table 13 were prepared by utilizing purified water for Examples 24–31 and Comparative Examples 13–36.

Commercially available ammonium bifluoride, sodium persulfate, sulfamic acid, hydrofluoric acid and isopropyl alcohol were utilized.

TABLE 13

| Compound | $NH_4HF_2$ (g/one liter of purified water) | $NH_2SO_3H$ (g/one liter of purified water) | $(NH_4)_2S_2O_8$ (g/one liter of purified water) | Sulfuric acid (g/one liter of purified water) | HF or $NH_4HF_2$ (g/one liter of purified water) | Isopropyl alcohol (v/v % added) |
|---|---|---|---|---|---|---|
| Ex. 24 | 120 | 80 | 40 | — | — | |
| Ex. 25 | 40 | 120 | 60 | — | — | |
| Ex. 26 | 120 | 80 | 40 | 90 | — | |
| Ex. 27 | 120 | 80 | 40 | — | — | 5 |
| Ex. 28 | 40 | 120 | 60 | — | — | 5 |
| Ex. 29 | 40 | 120 | 60 | — | — | 15 |
| Ex. 30 | 13.3 | 40 | 20 | — | — | |
| Ex. 31 | 8 | 24 | 12 | — | — | |
| Comp. Ex. 13 | — | — | — | — | 10% HF | |
| Comp. Ex. 14 | — | — | — | — | 20% HF | |
| Comp. Ex. 15 | — | — | — | — | 2% HF | |
| Comp. Ex. 16 | — | — | — | — | 30% $NH_4HF$ | |

Cleaning Ability Test

For testing cleaning ability, various types of CRT panel test-pieces shown below having a dimension of 50 mm×50mm×10 mm were prepared.

Types of Panel Test-Pieces

A: panel prior to inner-black coating

B: defective inner-black coated panel (to be refabricated)

C: defective panel (to be refabricated)

D: defective fluorescent layer panel (to be refabricated)

E: panel prior to outer coating

F: panel after outer coating

G: panel sintering processed after outer coating 500 ml of the compositions of Examples 1–3, 31–34, and Comparative Examples 13–16 were added into a beaker and agitated at a temperature of 25° C., then the above panel test-pieces were dipped into the beaker for a certain duration of time. The cleaning time for each cleaning compositions was measured until water has formed uniformly on the surface of the panel test-pieces (i.e., until the surfaces of the test-pieces became hydrophilic). The results were obtained and shown in the following table 14.

TABLE 14

| Type of panel test-piece | Cleaning composition | Treatment time (sec.) |
|---|---|---|
| A | Example 24 | 8 |
| | Example 24 | 7 |
| | Comparative Ex. 13 | 10 |
| B | Example 24 | 10 |
| | Example 24 | 6 |
| | Example 24 | 6 |
| | Example 24 | 5 |
| | Comparative Ex. 13 | 12 |
| C | Example 24 | 50 |
| | Comparative Ex. 13 | 50 |
| D | Example 24 | 12 |
| | Example 24 | 9 |
| | Example 24 | 8 |
| | Example 24 | 7 |
| | Comparative Ex. 13 | 12 |
| E | Example 24 | 10 |
| | Comparative Ex. 13 | 15 |
| F | Example 24 | 10 |

TABLE 14-continued

| Type of panel test-piece | Cleaning composition | Treatment time (sec.) |
|---|---|---|
| | Comparative Ex. 13 | 15 |
| G | Example 24 | 10 |

As it can be noted from the above table 14, the cleaning compositions of the present invention showed faster cleaning rates compared to the conventional cleaning compositions, and for treating the surfaces of the panel test-pieces, it was noted that fluorides content is decreased to lower etching activities. Further, when isopropyl alcohol was added as a supplement compound to the cleaning compositions of the present invention, the cleaning compositions were highly effective in decomposing organic substances.

Comparison of Surface Roughness

The test-piece A (panel prior to inner-black coating) was respectively treated by the cleaning compositions of Example 24 and Comparative Example 13 for 60 seconds at a temperature of 25° C. The surface roughness of the test-piece D was measured and shown in the below table 15.

TABLE 15

| Cleaning composition | Surface roughness (micrometers) |
|---|---|
| Example 23 | Ra:0.064 |
| | Rt:0.501 |
| Comparative Ex. 13 | Ra:0.069 |
| | Rt:0.724 |

Ra: average roughness of the central portion (micrometers)
Rt: maximum height of roughness (micrometers)

As it can be noted from the above table 15, an uniform surface roughness was indicated by the low Ra and Rt values of the cleaning compositions Example 24, which results in a higher adhesiveness of fluorescent layers, and as Rt value was drastically lower than Comparative Example 13, it was also found that the surface pits can be greatly improved.

Gloss Value and Water-Wettability Test II

A 15 inch test-piece G (panel sintering processed after outer coating) was prepared. The outer face of the test-piece G was polished by using conventional method utilizing cerium oxide at a polishing pressure of 4 kg/cm², while another test-piece D was cleaned manually by hand with polyethylene pad having the composition of Example 25 at a polishing pressure of 0.5 kg/cm² or less. The gloss value and water-wettability of the test-pieces were measured and compared with a normal fresh panel product, as shown by the below table 16.

TABLE 16

|  | Gloss value | Water-wettability |
| --- | --- | --- |
| Normal fresh panel | 97.25% | hydrophobic |
| Test-piece panel G polished with CeO₂ | 96.4% | hydrophobic |
| Test-piece panel G cleaned by composition of Example 25 | 97.25% | hydrophilic |

As it can be determined from the above table 16, the test-piece G cleaned with the composition of Example 25 had a high gloss value same as the normal fresh panel. The normal fresh panel which exhibited hydrophobicity, due the presence of organic and foreign materials on its surface, had formed an uniformed water layer after being treated with the composition of Example 25 and became hydrophilic. As a result, there were no defective panels in the subsequent coating processes.

Polishing with conventional cerium oxide leaves scratches which cause a sparking defect, and this can lead to a greater subsequent possibility of having defective panels during the re-coating process; as in the manufacture of color display tubes (CDT), defective panels are diverted to a lower grade color picture tubes (CPT) bringing a substantial loss to the manufacturing process. On the other hand, the composition of Example 25 leaves no scratches, thus enabling the re-manufacture of normal fresh panel products to be realized.

Example 32

A cleaning composition having ammonium bifluoride concentration of 40 g/L, ammonium persulfate concentration of 40 g/L and sulfamic acid concentration of 20 g/L was prepared by diluting the composition of Example 24 in an equal amount of water.

Comparative Example 17

12% hydrofluoric acid solution was prepared.

Comparison of Weight Reduction 20 ml of the composition of Comparative Example 17 and Examples 24, 25 and 32 were added into a beaker and bubbled. CRT test-pieces having a dimension of 50 mm×50 mm×10 mm were dipped into the respective solutions at 25° C. for 10 minutes. The weight reduction caused by etching of the compositions were measured and shown below in table 17.

TABLE 17

|  |  | Comp. Ex. 17 | Example 24 | Example 32 | Example 25 |
| --- | --- | --- | --- | --- | --- |
| Weight (g) | Prior to treatment | 36.78 | 37.52 | 37.05 | 35.78 |
|  | After treatment | 35.78 | 37.05 | 36.78 | 35.64 |

TABLE 17-continued

|  | Comp. Ex. 17 | Example 24 | Example 32 | Example 25 |
| --- | --- | --- | --- | --- |
| Weight reduced (%) | 2.72 | 1.25 | 0.73 | 0.39 |
| Amount of fluoride ion (ppm) | 114,000 | 80,000 | 40,000 | 26,000 |

As it can be noted from the above table 17, when etching silicon oxide layers, the etching rate depends on the content of fluoride ion present, however, when the fluorides ions are from its naturally occurring hydrofluoric acid solution, an aggressive etching activity is observed for the fluoride ions in proportion to the amount present. As silicon oxide in the layer is converted to fluoro-silicates, which comprise fluoride ions, in an equal amount of weight reduced, the homogeneity of solution having hydrofluoric acid deteriorate much faster than the compositions of the present invention.

Example 33

A cleaning composition was prepared by mixing isopropyl alcohol in a concentration of about 25% by volume into the composition of Example 24.

LCD Substrate Cleaning Test II

LCD bare glass test-pieces having a dimension of 50 mm×50 mm×0.7 mm were prepared. A diluted hydrofluoric acid solution (in 1:100 water ratio) conventionally used for cleaning silicon oxide substrates and a cleaning solution having the compositions of Examples 31, 27 and 33 were utilized to clean the test-pieces. The test-pieces were dipped into the respective solutions at 25° C. and agitated. The water-wettability and cleaning times were observed and measured, as shown by table 18 below.

TABLE 18

|  | Example 31 | Example 27 | Example 33 | Diluted HF solution |
| --- | --- | --- | --- | --- |
| Concentration of F⁻ in cleaning solution | 5320 | 5050 | 3990 | 4750 |
| Dipping time (sec.) | 10 | 5 | 3 | 40 |
| Water-wettability | hydrophilic | hydrophilic | hydrophilic | hydrophilic |

As it can be seen from table 18, the cleaning ability of the composition of the present invention was determined, as the hydrophilicity of the LCD test-pieces being treated was established from 3 to 10 seconds. The cleaning composition of the present invention having isopropyl alcohol exhibited a good cleaning ability, while the conventionally used diluted HF cleaning solution took more than 30 seconds to establish surface hydrophilicity for the LCD test-pieces.

Comparative Example 18

15% hydrofluoric acid solution was prepared.

Water-Wettability and Weight Reduction of Quartz Substrates

Quartz device test-pieces having a dimension of 50 mm×50 mm×3 mm to be used for wafer production were prepared. The test-pieces were dipped into the cleaning composition of Example 24 and Comparative Example 18, respectively, at 25° C. for 10 minutes. The weight reduction and water-wettability were measured and observed, and the presence of particles was visually inspected with naked eye. The results are shown below in table 19.

TABLE 19

| Cleaning composition | Weight reduced (%) | Water-wettability | Status of particle |
|---|---|---|---|
| Comparative Ex. 18 | 0.12 | hydrophilic | OK |
| Example 24 | 0.06 | hydrophilic | OK |

As it can be determined from the above table 19, the test-pieces became hydrophilic and its weight reduction was drastically less when the cleaning composition of Example 24 was utilized for cleaning compared to the cleaning composition of Comparative Example 18, which showed an excessive etching due to the hydrofluoric acid in its content. In comparison, the cleaning composition of Example 24 avoided any excessive etching of quartz devices, and its use in fabrication process of quartz devices would be appropriate for effectively removing contaminants accumulated on the surface of the quartz devices during the manufacturing process. Further, since the weight reduction in case of Example 24 is about half that in case of Comparative Example 18, the abrasion of the quartz devices is reduced so that the durability thereof is improved.

Wafer Cleaning Test

Wafer test-pieces Wa, Wb and Wc as shown below having a dimension of 5 mm×5 mm×650 micrometers were prepared. The test-pieces were dipped into the cleaning composition of Examples 24 and 25 at 25° C. The presence of particles and water-wettability were observed. The results are shown below in table 20.

Wa: test-piece for initial cleaning

Wb: test-piece prior to oxidation

Wc: test-piece after oxidation having silicon oxide layer with thickness of 1000 angstoms

TABLE 20

| Test-piece | Cleaning composition | Cleaning time (min.) | Hydrophobicity | Particle inspection |
|---|---|---|---|---|
| Wa | Example 24 | 5 | hydrophobicity | OK |
| Wb | Example 24 | 8 | hydrophobicity | OK |
| Wc | Example 24 | 3 | hydrophobicity | OK |
| Wc | Example 25 | 6 | hydrophobicity | OK |

In the above table 20, hydrophobicity indicates a complete removal of oxidation layer.

It was seen that the compositions of the present invention cleaned the wafer test-piece Wa in a short period of time even without the conventional pre-treatment of tetrachloroethane TCE and $H_2O_2$ used for removing organic substances. The cleaning time of the wafer test-piece Wb by the composition of the present invention was also observed to be fast without having the conventional pre-treatment of aqua regia ($HNO_3$ and HCl mixed in 1:3 ratio) and nitric acid.

For wafer test-piece Wc, the compositions of the present invention exhibited an etching rate of 166 to 500 angstroms per minute. Conventionally, for etching silicon oxide layer, 1000 angstroms is required to be etched within a range of one to 10 minutes, as such, the compositions of the present invention having fast etching rates are well suited to be used in etching silicon layers. Further, as described earlier, the content of fluorides added is adjusted to control the etching rates.

Examples 34–40 and Comparative Examples 19–20

3 g of a mixture comprising ammonium nitrate and ammonium bifluoride ($NH_4HF_2$) in a mixture ratio of 2:1 was added to the respective acid solutions show below in table 21. Silicon substrates were brought in contact with the prepared compositions and the reaction was observed and shown below in table 21.

TABLE 21

| | Inorganic acid | Concentration (vol%) | Reaction with Si |
|---|---|---|---|
| Example 34 | sulfuric acid | 40 | Yes |
| Example 35 | sulfuric acid | 50 | Yes |
| Example 36 | sulfuric acid | 70 | Yes |
| Example 37 | sulfuric acid | 90 | Yes |
| Example 38 | phosphoric acid | 60 | Yes |
| Example 39 | phosphoric acid | 70 | Yes |
| Example 40 | phosphoric acid | 80 | Yes |
| Comparative Ex. 19 | sulfuric acid | 30 | No |
| Comparative Ex. 20 | phosphoric acid | 50 | No |

A solute particle having a mixture of nitrates and fluorides was added and dissolved into the above inorganic acid solutions upto its saturated concentration, and the reaction was observed. As the amount of solute particles increased, the reaction with the silicon layer became more vigorous.

From table 21 above, the suitable amounts of inorganic acids which can be applied to the present invention was determined. An amount of sulfuric acid is in a range of from about 35% by volume to about 93 volume %, preferably, from about 45% by volume to about 65% by volume, and an amount of phosphoric acid should be in a range of from about 55% by volume to about 82 volume %, preferably, from about 65% by volume to about 75% by volume.

Example 41

A composition having 25 g/L of ammonium bifluoride, 900 g/L of sulfuric acid and 50 g/L of ammonium nitrate was prepared.

Example 42

A composition having 150 g/L of ammonium bifluoride, 900 g/L of sulfuric acid and 300 g/L of ammonium nitrate was prepared.

Comparative Example 21

A conventional etchant having an acid mixture of 70% nitrate, 50% hydrofluoric acid and 100% acetic acid in a composition ratio of 2.5:1:1 was prepared.

Comparison of Surface Roughness of Wafer Test-Pieces

Wafer test-pieces (already lapping processed) having a dimension of 50 mm×50 mm×750 micrometers to be chemically etched were prepared. The etching solutions of Example 41 and Comparative Example 21 were added into their respective 1000 ml teflon beaker. The wafer test-pieces were dipped into the air-bubbled etching solution at a temperature of 25° C. for 20 minutes. The surface roughness was measured and shown below in table 22.

TABLE 22

| Composition | Roughness (micrometers) | Measurement 1 | Measurement 2 | Measurement 3 | Measurement 4 | Measurement 5 | Avg. |
|---|---|---|---|---|---|---|---|
| Example 41 | Ra | 0.024 | 0.022 | 0.019 | 0.016 | 0.016 | 0.0194 |
|  | Rq | 0.031 | 0.03 | 0.024 | 0.021 | 0.021 | 0.0254 |
|  | Rt | 0.0234 | 0.312 | 0.143 | 0.141 | 0.141 | 0.2064 |
| Comparative Example 21 | Ra | 0.079 | 0.08 | 0.103 | 0.08 | 0.08 | 0.0844 |
|  | Rq | 0.101 | 0.103 | 0.145 | 0.104 | 0.105 | 0.1116 |
|  | Rt | 0.644 | 0.793 | 1.223 | 1.027 | 0.739 | 0.8852 |

Rq: mean square root height

As it can be seen from table 22, based on Ra, Rt and Rq values, the etching composition of Example 41 left much smoother surface roughness compared to the composition of Comparative Example 21.

Figure 2:
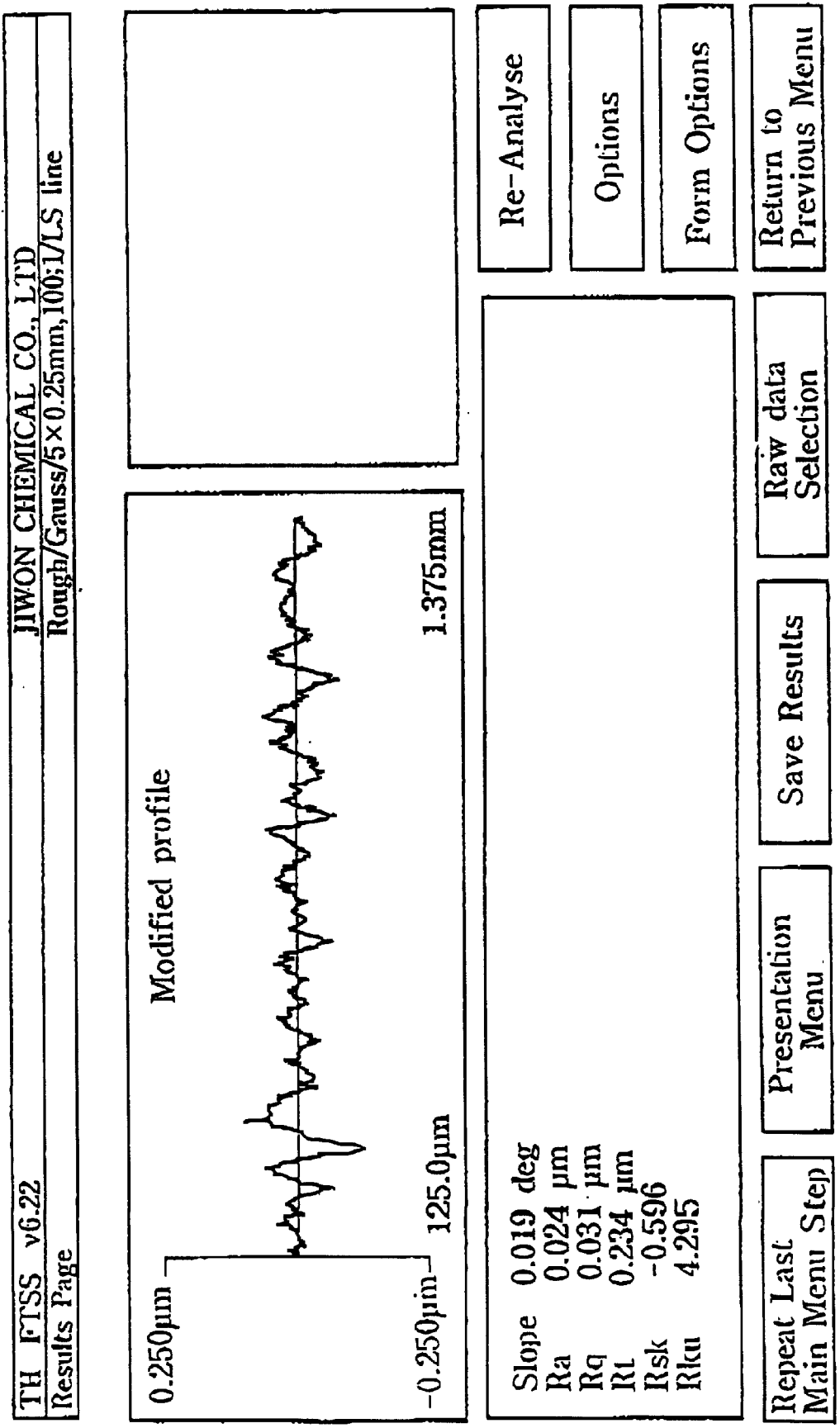
FIG. 2 is a graph showing a surface roughness of a semiconductor wafer after being etched by a cleaning and etching composition of the present invention.

After being etched by the compositions of Example 41 and Comparative Example 21, the surface roughness of the wafer test-pieces were measured by a surface roughness meter (Talysurf-II Series, Rank Taylor Hobson, UK) and Gauss filter. The results are shown in FIGS. 1 and 2 based on a scale of 250 micrometers. FIGS. 1 and 2 are graphs of the surface roughness of semiconductor wafer test-piece after being etched by the composition of Comparative Example 21 and the composition of the Example 41, respectively.

The wafer test-pieces were etched by the compositions of Examples 41 and 42 and Comparative Example 21. The etched amount (thickness), etching time, temperature and surface roughness were measured and shown below in table 23.

TABLE 23

| Composition | Etching time (min.) | Temperature (° C.) | Surface roughness (micrometers) | Etching thickness (micrometers) |
|---|---|---|---|---|
| Example 41 | 20 | 25–27 | Ra:0.019 Rt:0.206 | 25 |
| Example 42 | 2 | 25–40 | Ra:0.06 Rt:0.82 | 27 |
| Comp. Ex. 21 | 0.7 | 25–45 | Ra:0.084 Rt:0.885 | 32 |

As it can be determined from the above table 23, the compositions of Example 41 and 42 yielded a better surface roughness compared to the composition of Comparative Example 21, more specifically, the composition of Example 41, compared to the conventional mixed acid etchant, not only etched 7 micrometers less but also exhibited excellent results in factors related to surface roughness. For consequent increases in temperature caused by increased reaction, the composition of Example 41 showed only 2 ° C. increase in temperature compared the composition of Comparative Example 21 which showed 20° C. increase. Thus, the composition of Example 41 showed a superior reaction stability over the composition of Comparative Example 21.

Although the composition of Example 42 also showed an increase in temperature and amount etched when ammonium bifluoride and nitrates were added to increase the etching rate, still a better surface roughness was obtained compared to the composition of Comparative Example 21.

Conventionally, an uniformed smooth surface cannot be obtained from the fast etching rates. As such, acetic acid or phosphoric acid is commonly added to the mixed acid etchant to slow the reaction rate. In some cases, a mixed acid etchant having saturated amount of fluoro-silicate is added to the reacting solution to suppress the reaction rate. In contrast, the compositions of the present invention exhibit slow reaction rates, and etching rates can be controlled by adjusting the amount of composition to obtain a desirable smooth substrate surface.

Examples 43–46

An etching composition for etching silicon substrates was prepared by adding 90 g (for Example 43), 180 g (for Example 44), 270 g (for Example 45) and 360 g (for Example 46) of a solute mixture of ammonium nitrate and acidic ammonium bifluoride ($NH_4HF_2$) mixed in 2:1 ratio into 50% sulfuric acid solution. Silicon wafer test-pieces (already lapping processed) having a dimension of 50 mm×50 mm×750 micrometers to be used for chemical etching were prepared.

Surface Roughness and Etching Rate Measurement

The wafer test-pieces were dipped into the etching solution of Examples 43–46 and Comparative Example 21 (conventional etchant composition) at a temperature of 25° C. The surface roughness and etching time were measured and shown below in tables 24 and 25.

TABLE 24

|  | Example 43 | Comparative Ex. 21 |
|---|---|---|
| Etching time | 20 minutes | 40 seconds |
| Roughness (micrometers) Ra/Rq/Rt | 0.0120/0.031/0.251 | 0.120/0.145/1.257 |
| Etching rate (micrometer/min) | 1 | 12 |

TABLE 25

|  | Example 43 | Example 44 | Example 45 | Example 46 |
|---|---|---|---|---|
| Etching rate (micrometer/min) | 1 | 3 | 6 | 9 |

As it can be noted from the above tables 24 and 25, the compositions of the present invention exhibited slower etching rates compared to the conventional mixed acid etchant, however, a much better surface roughness was obtained. The level of smooth surface which can be obtained by the mixed acid ethant is limited due to the vigorous reaction with silicon. For inhibitor, phosphoric acid decreased the reaction rate 3 times compared to acetic acid.

Further, the etching rate was also determined to vary depending on the amount of the solute mixture of ammonium nitrate and acidic ammonium bifluoride utilized. A composition ratio of the solute mixture of ammonium nitrate and acidic ammonium bifluoride should be in a range of from about 1:9 to about 9:1, preferably, from about 3:7 to about 7:3.

The solute mixture can be added from 3 g/L to its saturated concentration. The saturated concentration can vary according to the concentration of solution to which the solute mixture is to be added. Accordingly, the amount of solute mixture should be utilized in a range of from about 3 g/L to about 500 g/L.

Forming Pattern on Silicon in LCD Manufacturing Process

A LCD bare glass test-piece having a silicon layer of 2500 angstroms thickness was prepared. A photo-resist pattern having a thickness of 5 micrometers to be used for etching mask was prepared by a conventional photolithography method. The etchant composition of Example 44 was utilized to etch the test-piece at 25° C. for 20 seconds. After etching, the test-piece was washed and the photo-resist was removed by acetone. The test-piece was then examined under microscope and the formation of a clear Si pattern was observed.

Conventionally, dry etching method is also utilized for etching the silicon layer in the manufacture of LCD. However, in applying wet-etching, it is extremely difficult to obtain micro-patterning with the conventional mixed acid etchant. In contrast, the compositions of the present invention is suitable and can be implemented for wet-etching silicon layers to establish a fine micro-patterning.

Removal of Silicon Layer in Quartz Substrates

Quartz test-pieces having a silicon layer of 1000 angstroms thickness were prepared. The etchant compositions of Example 44 and Comparative Example 18 were utilized to etch the test-pieces at 25° C. for 20 seconds. It was observed that the etchant composition of Example 44 had removed the silicon layer while leaving no damages to the surface of the quartz test-piece. On the other hand, the etchant composition of Comparative Example imparted damages to the quartz test-piece.

In view of the manufacturing process of semiconductors, in which wafers may comprise a various type of silicon layers, and numerous wafer manufacturing devices are made of quartz and SiC materials also having silicon layers, the compositions of the present invention can be implemented as an effective means for removing silicon layers and for obtaining fine micro-patterns.

According to the additional experiments of the present inventor, when $NaNO_3$ is utilized instead of $NH_4NO_3$, the reaction similar to the respective reaction described was observed, and the same was also observed when KF and $KHF_2$ were utilized instead of $NH_4HF_2$.

While the present invention has been particularly shown and described with reference to particular Examples thereof, it will be understood by those skilled in the art that various changes in form and details may be effected therein without departing from the spirit and scope of the invention as defined by the appended claims.

What is claimed is:

1. A composition for chemical cleaning and etching substrates having silicon comprising:

an inorganic acid dissolved in water at a concentration of from about 35% to about 93% for accelerating etching process;

a nitrate in a dissolved concentration of from about 1 g/L to about 450 g/L for oxidizing silicon into silicon oxide; and a fluoride in a dissolved concentration of from about 1 g/L to about 450 g/L, which releases fluoride ion which reacts with said silicon oxide to form fluoro-silicate, wherein a composition ratio of said fluoride and said nitrate is from about 3:7 to about 7:3.

2. A composition for cleaning and etching as claimed in claim 1, wherein said inorganic acid is sulfuric acid, phosphoric acid or a mixture thereof.

3. A composition for cleaning and etching as claimed in claim 1, wherein said nitrate is at least one selected from the group consisting of sodium nitrate, ammonium nitrate, potassium nitrate and barium nitrate.

4. A composition for cleaning and etching as claimed in claim 1, wherein said fluoride is at least one selected from the group consisting of ammonium bifluoride, ammonium fluoride, sodium fluoride, potassium bifluoride, sodium bifluoride, barium fluoride, potassium fluoride and ammonium borofluoride.

5. A composition for cleaning and etching substrates having silicon comprising:

an inorganic acid dissolved in water at a concentration of from about 35% to about 93% for accelerating etching process;

ammonium nitrate in a dissolved concentration of from about 1 g/L to about 450 g/L for oxidizing silicon into silicon oxide; and ammonium bifluoride in a dissolved concentration of from about 1 g/L to about 450 g/L, which releases fluoride ion which reacts with said silicon oxide to form fluoro-silicate, wherein a composition ratio of said ammonium nitrate and said ammonium bifluoride is from about 3:7 to about 7:3.

6. A composition for cleaning and etching as claimed in claim 5, wherein said inorganic acid is sulfuric acid dissolved in water at a concentration of from about 45% by volume to about 65% by volume.

7. A composition for cleaning and etching as claimed in claim 5, wherein said inorganic acid is phosphoric acid dissolved in water at a concentration of from about 65% by volume to about 75% by volume.

* * * * *